United States Patent [19]

Mohr

[11] 4,322,161

[45] Mar. 30, 1982

[54] STRIPPER'S TABLE AND METHOD OF COMPOSITING LITHOGRAPHIC WORK PIECES

[76] Inventor: Edward L. Mohr, 4445 S. Delaware St., Englewood, Colo. 80110

[21] Appl. No.: 126,415

[22] Filed: Mar. 3, 1980

[51] Int. Cl.$^3$ ............................................. G03B 27/20
[52] U.S. Cl. ....................................... 355/93; 355/23; 355/95
[58] Field of Search ....................... 355/91, 89, 93, 23, 355/85, 86, 87, 95, 11, 18, 73, 76, 21

[56] References Cited

U.S. PATENT DOCUMENTS

| | | | |
|---|---|---|---|
| 1,919,735 | 7/1933 | Lane | 355/76 X |
| 3,147,683 | 9/1964 | Hulen | 355/93 X |
| 3,176,601 | 4/1965 | Bradley | 355/91 X |
| 3,381,573 | 5/1968 | Caldwell | 355/23 X |
| 3,475,094 | 10/1969 | Kucera et al. | 355/23 |
| 3,545,860 | 12/1970 | Hutchins | 355/91 |
| 3,588,079 | 6/1971 | Addy et al. | 269/21 |
| 3,625,610 | 12/1971 | Raymond | 355/76 |
| 3,635,560 | 1/1972 | Hulen | 355/91 X |
| 3,762,815 | 10/1973 | Friedel | 355/73 |
| 3,797,932 | 3/1974 | Endter et al. | 355/18 |
| 4,006,984 | 2/1977 | Friese | 355/11 |

*Primary Examiner*—Richard A. Wintercorn
*Attorney, Agent, or Firm*—Kyle W. Rost

[57] ABSTRACT

An open face vacuum light table with an associated overhead high intensity light source is provided with a movable, preferably pivotable, framer structure capable of overlying either of two table surface areas, at least one of which is provided with an apparatus, for example a vacuum grid, for drawing lithographic work pieces into close contact for light induced image recordation on film or other light sensitive receiver. The frame may carry a clear sheet of stripping base material that also serves as the vacuum completing face of the vacuum grid. The table is provided with stripping pin grooves about the perimeter of the entire table, an entire sub-area, partially around the table or a sub-area. Apparatus for maintaining one face of the pivoted frame in coplanar relationship with either of the table areas over which the frame is located may include an elevator mechanism associated with one or both table areas or an eccentric pivot between the frame and table. Digital positioning apparatus along one or two coordinate axes associated with one or both table areas provides a digital indication of work piece location and may relocate work pieces by digitally selected location indicia. The method of operation includes temporarily attaching preliminary work pieces to the common base material while over a first side of the table; attaching the light sensitive receiver over the second side of the table that includes a vacuum grid, pivoting the frame and base material over the second side of the table; applying a vacuum to the vacuum grid, utilizing the base material to complete the vacuum; and exposing the receiver to light passing through the preliminary work pieces.

31 Claims, 7 Drawing Figures

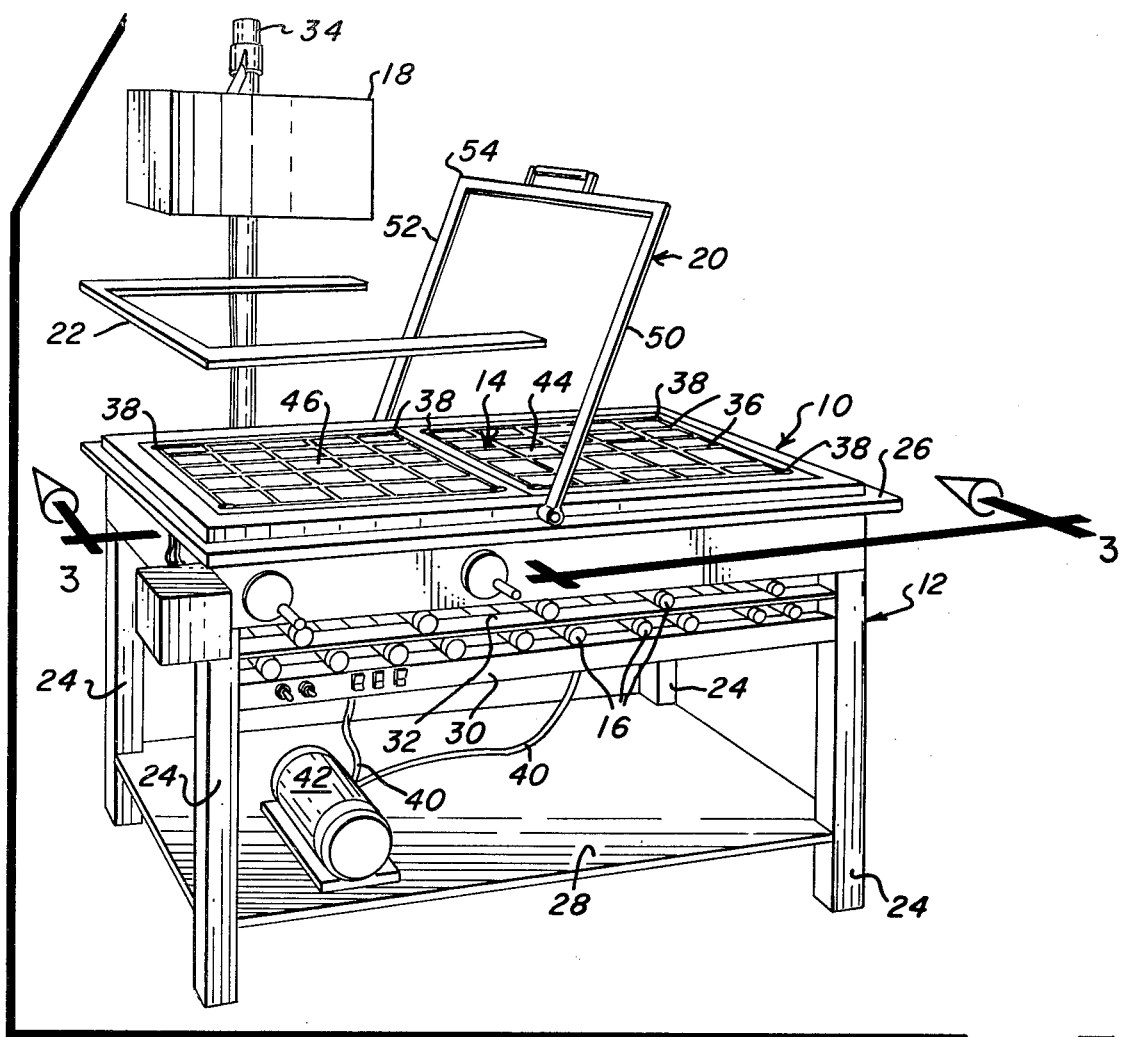
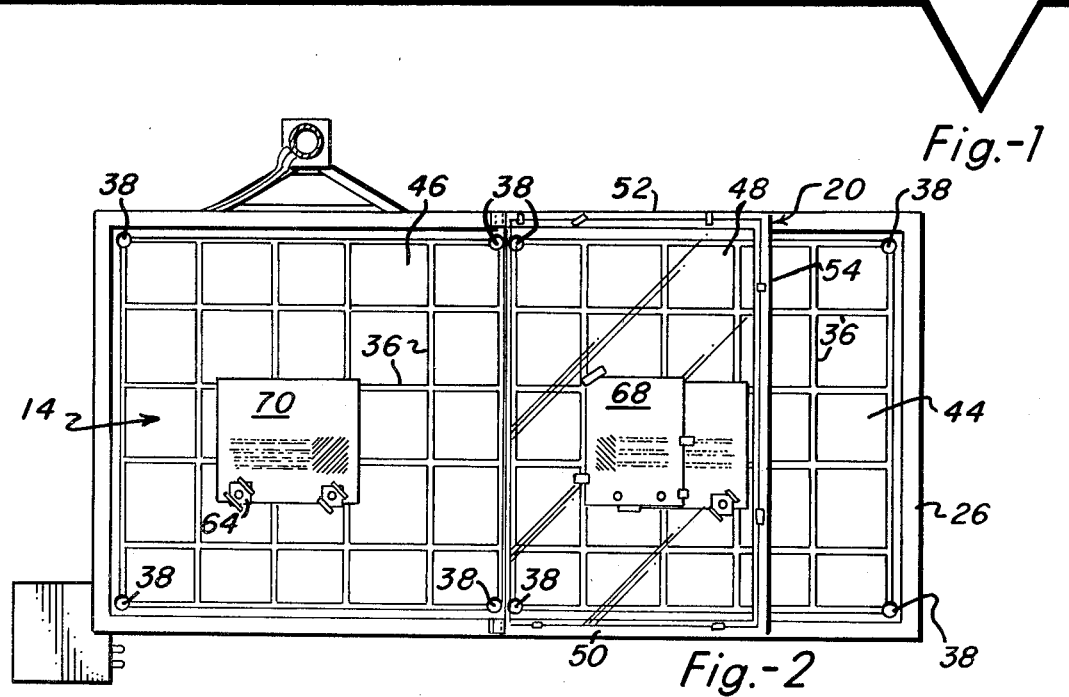
Fig.-1
Fig.-2

STRIPPER'S TABLE AND METHOD OF COMPOSITING LITHOGRAPHIC WORK PIECES

BACKGROUND OF THE INVENTION

1. Field of the Invention

The invention relates to photocopying and more specifically to color stripping and compositing in the lithographic printing trade. An apparatus is described for reproduction art compositing, one-station film positioning, composition, multiple imaging, proofing, and plate exposure.

2. Description of the Prior Art

In the lithographic printing trade, camera negatives, positives, or color separations of a desired subject are delivered to a stripping station, usually a light table, at which time the negatives, positives, color separation negatives and screen tints are taped to various stripping bases (in some cases registered by electronic makeready equipment) as the finished product may dictate. These various stripping bases, position registered to one another and in some cases to the correct relative position to the printing plate, are known as working flats or in some cases as final plate ready flats. In either case, the flats are then transferred to a vacuum frame with an accompanying light source for exposure to another medium: film, proofing material, or the printing plate. When placing these individual flats in the vacuum frame, they are generally placed on register pins or in some cases by register marks for multiple imaging, after which vacuum closeness is applied prior to exposure to the receiving medium.

The division of tasks is generally accompanied by a physical separation of equipment and may also involve a separation of labor. Consequently, a good deal of time is spent in handling and, with complex work pieces, providing directions to those who must perform subsequent steps. Moving film from location to location or from machine to machine also offers the possibility that oral or written exposure directions will be misinterpretted, film scratched, minute dirt particles picked up, film or flat stretched or otherwise misaligned from the desired register, reducing the quality of the finished product. The physical separation of work stations demands that each negative and its base be prepared as a complete package of reasonably defined boundries, leading to the rapid consumption of stripping bases, screen tints, and like material that must be cut to fit at required locations on a stripping base.

Much of the labor, handling, material consumption, equipment, time and quality problems in the prior art are eliminated by means of the stripper's table now described.

SUMMARY OF THE INVENTION

A stripper's table provides a suitable base to support an open-face vacuum light table top, underlying light sources having a plurality of selectable wavelengths, an overhead light source, and a centrally pivoted U bar capable of swinging over either half of the light table top. The halves of the table top may be independent of each other, with or without vacuum grid and have means associated with either or both for altering the relative vertical position of a table top half with respect to the pivoted U bar or with respect to the other table top half, or means may be provided for altering the vertical position of the U bar plane when swung over one of the top halves. A removable U bar may, in combination with the pivoted U bar, substantially complete a perimeter around the table top; and both U bars may have a guide slot adapted to receive the base of stripping pins and provide a straight edge for positioning the pins around the perimeter of the table top. A permanent groove in the table top or a removable bar grooved as described in connection with the U bars may be located between halves of the table top, preferably along the axis connecting the pivot points of the swinging U bar, to form a perimeter around only one-half of the table top. Through appropriate selection of U bars and groove locations, stripping pins may be accurately located about the total perimeter of the table top, one half thereof, or one-half, or one-half plus a segment of the total perimeter. Spacing means such as gauge bars of predetermined lengths that fit in the guide slot provide an accurate and reproducable separation between such pins. A clear or transparent flexible sheet of combined base material and vacuum completing face may be termporarily attached to the pivoted guide bar, either on a face of the bar or near the center of its thickness, and be register punched or otherwise used as a common base for work pieces. This common base is swung with the guide bar between opposite halves of the table top when desired.

The stripper's table base structure also offers a suitable means for incorporating accurate electronic digital positioning and multiple imaging capability while a work piece is being held in vacuum closeness to the receiving medium.

The main object of the invention is to create a single piece of equipment that permits the integrated performance of lithographic stripping functions, including positioning, compositing, multiple imaging, proofing, and plate exposing.

Another important object is to eliminate wasted materials and time spent in transferring work pieces between successive processing stations and equipment, and to provide the capability for automatically repeating the desired registration between work pieces when performing successive operations on a single piece of integrated processing equipment.

Other objects and advantages will become evident from the following description.

BRIEF DESCRIPTION OF THE DRAWINGS

FIG. 1 is a perspective view of the stripper's table with the removable U bar shown in exploded position for clarity.

FIG. 2 is a top plan view of the table of FIG. 1 with the overhead light eliminated for clarity and with representative work pieces added.

DESCRIPTION OF THE PREFERRED EMBODIMENT

Figure 3:
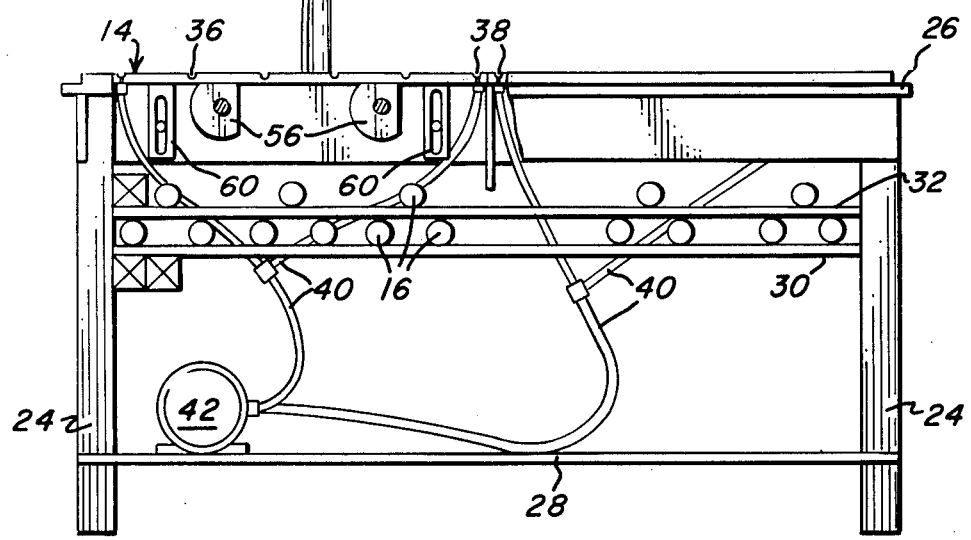
FIG. 3 is a vertical cross-sectional view taken through the plane of line 3—3 of FIG. 1.

The invention is embodied in a stripper's table 10 best shown in FIG. 1 to include a table base 12 carrying a two part vacuum grid top 14 having light sources 16 and 18 respectively under and over the top. First and second U bars 20 and 22 are associated with the table, U bar 20 being pivotally attached to the frame for movement over either part of the vacuum grid and U bar 22 being attachable and removable from the table base at a fixed location. Suitable peripheral equipment such as switches, vacuum pumps, and pin guides may be supplied as necessary for a particular application.

Table base 12 is suitably configured as a carrier for the remaining portions of the stripper's table and may include four vertical legs 24 of any desired height, joined to a rectangular frame 26 at the upper end of the legs for receiving and supporting the vacuum grid top. A bottom shelf 28 may also interconnect the legs, and intermediate rods or beams 30 and 32 may extend between pairs of adjacent legs on opposite sides or ends of the table to support light sources 16. Overhead light source 18 is mounted on a stand 34 attached to the base 12, for example at frame 26.

The two part vacuum grid top 14 is formed from a substance that permits passage of light in the relevant wavelengths for the type of lithographic work to be performed on the table, commonly yellow, white, and ultraviolet light. In this respect, the table is a light table and the surface may be formed from a translucent material such as glass or plastic. Vacuum applying means such as vacuum grooves 36 are present in the table top. Vacuum grooves are known in the art to be a recessed pattern or grid in an otherwise smooth plane, connected to a source of suction. In a square grid pattern, the source of suction may be a draw hole 38 in each corner of the grid connected by hose 40 to suction pump 42 carried, for example, on the bottom shelf of the table. The two part top is divided into two independent halves, such as right half 44 and left half 46 as viewed in FIG. 2, and each of these halves is separately connected to the suction pump 42 for independent application of vacuum to a work piece on either half. The overhead light source 18, which is preferably a high intensity light is height adjustable on stand 34 and also is capable of swinging laterally over either half of the table top. The underlying light source 16 may be a plurality of fluorescent tubes carried between the beams 30 and 32 in two mutually parallel planes, also parallel with the plane of the table top. The lower plane extending between beams 30 may consist of alternate white and yellow colored tubes while the upper plane extending between beams 32 may be ultraviolet lights. The spacing between the planes and the spacing between the tubes of the upper plane is sufficient that light from the lower tubes reaches the light table without casting a substantial shadow. Each color of light is independently activated by suitable switches.

First U bar 20 is pivotally attached to the table 10 in such a manner that it may be moved between two extreme positions in which it overlies one or the other of the independent halves of the table top in a parallel plane immediately adjacent to or coincident to the plane of the table top. To achieve this pivotal arrangement, the U bar 20 may be mounted on hinge pins or bearings carried by the table frame 26 substantially along a common axis following the dividing line between the halves of the top. This bar may then be swung over either the right or left half of the top, assuming substantially identical mirror image positions with respect to either top half as compared to the other. The bar 20 is adapted to receive a sheet 48, FIG. 2, of transparent material such as acetate within the center of the U shape and attached to the forward side 50, rearward side 52, and end 54 of the U bar, suspended by a suitable means such as a slot, clamps, pins, or tape to these three edges of the bar. The sheet 48 will thus move with the U bar from one side of the table top to the other and overlie each half and its respective vacuum grid.

It is desired that the clear sheet 48 assume a substantially identical relationship with each half of the table top when pivoted into overlying position with respect thereto. Therefore, if the sheet is suspended exactly in the center of the thickness of the bar edge members 50,52,54 and the bar itself is so mounted that the exact center of its thickness defines a plane immediately adjacent to the top plane of each table top half, then the U bar will hold the sheet 48 in such an exact parallel adjacent plane with respect to either top half.

For some applications or for ease of attaching the sheet 48 to the U bar, it may be desired to mount the sheet on one face of the bar. Assuming the bar has a significant thickness, such as ¼ inch, special provision must be made to assure that the sheet maintains equivalent overlying position with respect to either half of the top. Several means may accomplish this, including an eccentric mounting of the U bar to the frame 26 to raise the plane of the U bar by the thickness of the bar edges when the bar is swung to overlie one of the top halves; or an elevator means for raising one half of the table top by the thickness of the U bar edge members. Either of these constructions could preserve the ability of the U bar to suspend the sheet 48 in a plane substantially adjacent to either half of the table top, even if the clear sheet is mounted on a face of the bar. In FIGS. 1 and 3, a cam arrangement is proposed wherein the left half 46 of the table top is carried on cams 56 having at least two elevational positions. In one position, as shown in FIG. 3, the left half is supported in the same plane as the right half; however, by rotation of the cranks 58, FIG. 1, in the counterclockwise direction by ninety degrees, the left half would be lowered to a plane below the plane of the right half. Additional cam positions might be provided to raise the left half above the right; and the right half may also be provided with a cam elevator means. Guides 60, FIG. 3, provide stability and uniformity to a movable top surface, and the cams 56 may be located in pairs at the opposite edges of the table top to provide four point support in any position.

Figure 4:
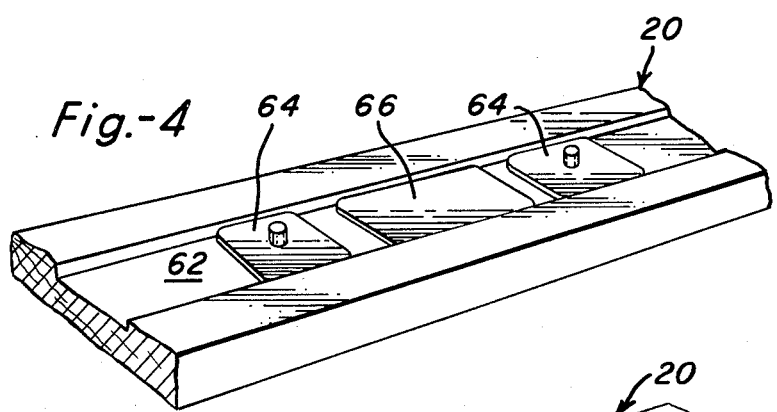
FIG. 4 is a close-up fragmentary view of a U bar showing the guide slot, stripping pins, and gauge bar.

The second U bar 22 provides a complimentary surface to the first U bar 20 when the latter is employed in a temporarily stationary position over either the right or left half of the top 14. Both bars may be provided with registration means such as a guide slot 62, FIG. 4, for receiving standard stripping pins 64, which may be taped at the desired location. The second U bar completes a full available perimeter around the entire table top for placement of such stripping pins, and is itself precisely located on pins or other positioning means. A suitable means for locating the stripping pins at predetermined spacings may be provided in the form of guage bars 66 that have a determined length and are carried in the guide slot 62 as spaces between stripping pins.

The stripper's table 10 can now be understood to permit the integration of tasks previously carried out at independent locations on separate equipment, and in accomplishing this, to eliminate numerous intermediate steps and permit material savings. Also, the table permits certain tasks to be carried out that previously were impractical. Thus, the advantages include substantial material savings by elimination of many previously independent pieces of equipment; time saving by eliminating the need to move a workpiece between separate equipment; and quality improvement in the finished product by elimination of the need for oral or written instructions to accompany complex film assemblies and elimination of the need to position such film assemblies in separate flats, both by virtue of the on-the-spot functionability of the table 10. Double sided dylux proofing can be accomplished simultaneously, as compared to single sided proofing that is conventionally accomplished.

The transparent, flexible acetate sheet mentioned in connection with the centrally pivoted U bar provides a reuseable one-piece base on which working or build-up film 68 may be temporarily taped, while operating over one vacuum grid such as 44. The base may be temporarily taped or pinned to the pivoting U bar for immediate, accurate swingover to the adjacent vacuum grid 46 with working film in registered position on the base, emulsion side down with respect to the second grid. Intermediate film 70 may be in registered position on the second grid, emulsion side up. The working film is then vacuum contacted with the intermediate film and an exposure made with the high intensity overhead light. Thereafter, the U bar and its reuseable base are swung back to the first grid, after which the original working film can be untaped and subsequent working film that physically or materially overlaps, interfits or composits into the image created with the original working film may be taped to the common base, after which the swingover, vacuum, and exposure steps can be repeated. This process requires less time, less taping, and less tape than in conventional processing. The single common base is economical in stripping base materials and saves time and material in otherwise register-punching numerous base materials as is required in the prior art. The common base serves the dual purpose of providing a vacuum face and stripping base, and the U bar automatically prepositions the base over the intermediate film prior to exposure, thereby eliminating the need for hand placement of film on separate bases.

Quality of the finished product is improved by virtue of less handling of intermediate stages of the work piece. Less chance exists for working film movement due to stretch, climatic conditions or other locally variable conditions that may differ from room to room or machine to machine in a conventional processing plant. The quality of registration of various images within the same color or one color to the next color in a continuing sequence is mechanically held with better control by the same person in the same location. Vacuum closeness between the one stripping base and underlying master positioning medium is also available. The underlying light sources permit images to be identified more readily prior to intermediate exposure. The transparent base may be marked with fine blue guide lines, visible from the underlying lights, for initial positioning of film preceding exposure.

The ability to repeatedly register working and intermediate film on the same piece of equipment provides a number of other economies as well. A screen angle indicator and guide may be readily positioned and then repositioned by taping at the same angle on the vacuum grid numerous times adjacent to unexposed intermediate film. This permits the accurate angling and long time repeated use of a single set of screen tints, as compared to the conventional method of cutting off the desired screen portion and taping the angle. The screen may now remain intact when falling outside the vacuum grid with the result that it is possible to visually angle with the entire screen sheet, vacuum contact and expose any intermediate or final film in emulsion to emulsion contact, and immediately replace the entire screen sheet into its original screen set.

The U bar also permits faster and more accurate page crossovers utilizing only one film or set of film prior to compositing. The yellow underlight, which is non-exposing, permits visibility in spot checking just prior to intermediate exposure, resulting in less chance of double exposing the same image area. Photomechanical chokes and spreads can be done on-the-spot. Another benefit is the educational advantage gained by the uninterrupted sequence of operations.

When the removable U bar is used in combination with the centrally pivoted U bar, a straight edge guiding slot is available around the total perimeter of both vacuum grids. This permits the stripping pins to be quickly positioned in perfect alignment, and by use of the gauge bars, at equal distances, for multi-imaged composites either on film or plates. Stepping may be accomplished quickly and inexpensively. The fixed perimeter allows temporary camera pin negative-to-plate imposition pinning prior to composite negative or plate exposure.

The stripper's table is also useful in copy or artboard preparation, for preparing the reproduction copy prior to using the graphic arts camera on the working negative. The stripper's table equipped with the pivoting U bar and its carried clear acetate surface permits utilization of four surfaces in readily visible form and register to one another. Copy preparation may then proceed in the following manner. First, a copy layout grid for the copy area is placed over one of the vacuum grids, such as the right grid. Within that layout grid, the separate components such as illustrations, text, and pictures are positioned on a transparent or semitransparent base, with the correct reading side of the layout grid facing down. Next, the pivoting U bar with its vacuum-completing face is placed over the right vacuum grid, and templates consisting of clear areas for overhead light exposure are fastened to the top surface of the vacuum-completing face, using the underlying layout guide for positioning. Light sensitive receiver such as paper or film is placed over the left vacuum grid. The U bar is then swung over the left vacuum grid and the vacuum completing face is vacuum contacted to the light sensitive receiver, after which an overhead light exposure is made. This effectively transfers all template forms to one receiver. Previously these template forms were used only as mechanical cutting or drawing guides. After the U bar has been swung to the left grid and vacuum applied, but prior to exposure, the upper face of the vacuum-completing transparent sheet may receive further templates for light blockage to incorporate patterns within the underside template pattern. Positioning of such supplemental templates is aided by yellow underlighting.

The stripper's table offers an excellant possibility for interaction with emerging printing technology. Advancing from present practice in the conventional art department, but still utilizing the graphic arts camera, in some instances, it is possible for the artist to furnish to the printer registered copy that is color broken down, instead of the conventional tissue overlayment that requires an explanation to the printer of the desired color breakdown. The artist may then have a positive reading image or copy for touch up. Photomechanical images can be incorporated into the artist's copy instead of overleaving and mechanically cutting them as is now done. Close fitting image material can be compiled by separate exposures rather than by cutting and pasting them in adjacent positions, and the camera would then not pick up edge lines of the mechanically placed items, eliminating the present need to opaque such lines. Also, less stripping material such as vinyl or clear mylar is required. Thus, one camera negative per color is used for camera lens projection dot-for-dot rendition quality. When better rendition is required, another "window" negative must be substituted for a camera negative, and the sharper rendition negatives would be double burned into registered psotion with the relevant color, utilizing the knockout window.

A further advanced system might employ computerized cold type set in the negative or positive form and composited with other images, such as color separations, for each color breakdown onto paper or film. In this instance, no graphic arts camera is necessary after the color separated positive has been accomplished. Individual color paper positives may be emulsion faced down onto positive color proofing material, after which color rendition and breakdown can be observed prior to contacting or printing. Sharper dot-for-dot rendition can be obtained by eliminating the camera lens projected light step used in making the color separated positive. Color correction, after viewing the color proof, can be done while contacting the paper positive to correct reading positive ready for plate exposure. This is possible by controlling light exposure time, blockage, and interspersing spacing. Conventionally this is now done by chemical dot etching. Less expensive developing systems may be used with the proposed system due to the fact that hard dot contacting chemistry is not affected by oxidation, as is the chemistry of developing camera light projection film emulsion.

In relatively simple electronic printing systems that employ laser reading of one color to a computerized storage or for transfer to a printing system, the stripper's table efficiently produces a single or one surface color separated copy in register to other colors, as would be required for electronic reading of only one color. In more sophisticated electronic color separated and computerized storage or transfer systems, the stripper's table is capable of efficiently compositing various images onto an all-color register of pages in imposed position, from a positioning to a laser reading area, with the imposition and light conditions necessary for electronic image transfer.

Figure 5:
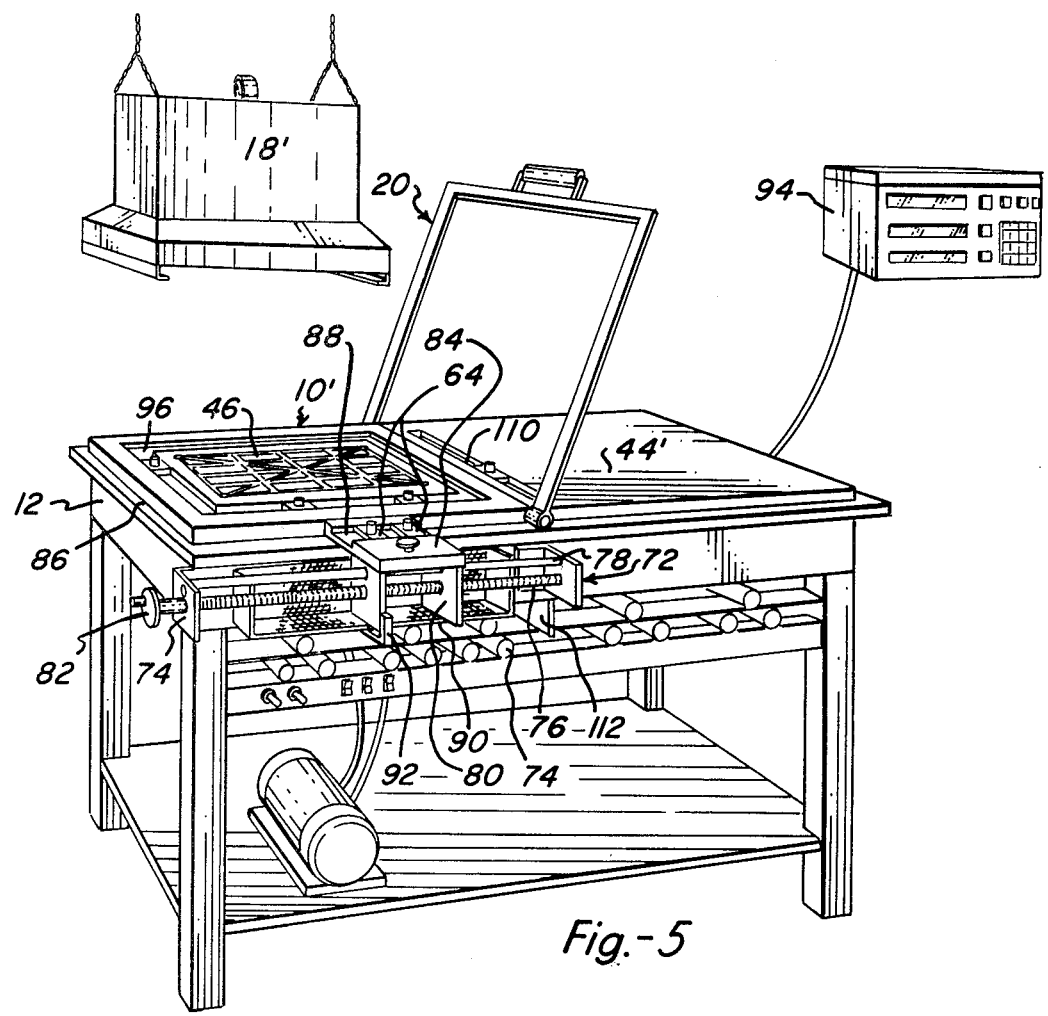
FIG. 5 is a perspective view of a modified embodiment of the stripper's table showing alternate locations for the stripping pin groove and showing a digital reading stepping device representatively located on one axis.

With reference now to FIG. 5, a modified embodiment 10 of the stripper's table offers the capability for greater automation and increased accuracy and speed for certain functions. Parts similar to those described in the previous embodiment are similarly numbered. A first difference, which is not specific to this embodiment but may also be employed in the previous embodiment, is that only one-half of the table top has a vacuum grid, while the other half, in this case right half 44', is a smooth light table surface providing an unobstructed work area. Another variation applicable to either embodiment of the table is that the overhead light 18' may be carried externally of any physical connection to the table and therefore may be suspended from another structure in either a fixed or movable manner. This type of overhead light may be a mercury vapor light, a metal halide light, or any other suitable light source, the specific nature of which may be dictated by the requirements of of light sensitive materials such as film that itself constitutes no part of the invention.

An addition in the embodiment of FIG. 5 is a means for automatically positioning a work piece with a high degree of accuracy on the vacuum grid 46. A linear positioning apparatus 72 is mounted to the table base 12. The apparatus includes mounting brackets 74 carrying between them screw 76 and guide rod 78. A carriage 80 rides on the guide rod and is moved in response to the rotation of the screw, in turn controlled by a suitable moving means 82 such as a hand operated crank or a motor. The carriage includes a platform 84 having its upper surface substantially coplanar with the surface of the vacuum grid 46. The platform may move along a stabilizing surface such as step 86 at the edge of the vacuum grid top, and the platform itself supports stripping pins 64 in groove 88. The carriage position may be accurately determined by a digital reading device including a sensor box 90 associated with the apparatus 72 and a reading head 92 carried by carriage 80 to move with respect to the sensor box. A read-out module 94 receives signals from the sensor box and head to provide a digital indication of the relative position of the head with respect to the box and hence the position of the carriage with respect to the vacuum grid. Digital reading devices of this type are commercially available and have in the past been applied to machine tools.

The digital reading device 72 is shown along only one side of the stripper's table, in FIG. 5 the front edge, providing digitally controlled positioning along a single axis. If a stepping operation is to be performed, the work piece is register punched to the pins 64 on carriage 80 to provide two point alignment, and the top of the work piece is punched to engage a stripping pin located at the opposite edge of the vacuum grid, such as in groove 96. Each of the desired locations for the work piece are digitally determined according to the position of carriage 80, and for each of such locations a corresponding pin is temporarily taped in the groove 96. Thereafter, when the stepping operation is being performed, the carriage is accurately located by the digital read-out and the top of the work piece is secured to a prelocated pin, and movement from one location to another is accomplished rapidly and accurately by moving the carriage to the next digitally selected location and transferring the work piece top to the next prelocated pin.

Figure 7:
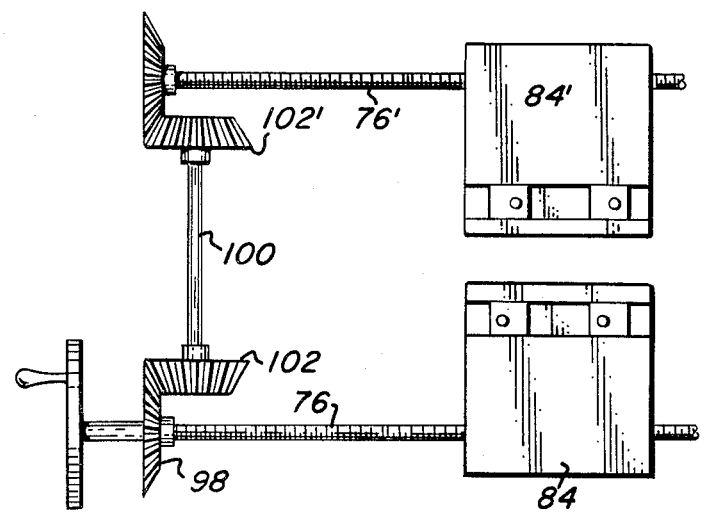
FIG. 7 is a plan view of apparatus for synchronizing movement of a stepping device.

In addition to single axis digital positioning, two axis digital positioning is accomplished with additional identical digital reading equipment located on a perpendicular side edge of the table and having an associated carriage 84. The location of any point on the table could then be defined by digitally read X-Y coordinates. The linear positioning apparatus of each axis may be coupled to a cooperative carriage 84' arranged to operate in parallel with its carriage 84 but on the opposite edge of the vacuum grid. In FIG. 7, carriage 84 is shown to operate on the screw 76 along one axis as previously described; and the cooperating carriage 84' operates on a parallel screw 76'. Each screw is associated with a bevel gear 98, 98', and a perpendicular shaft 100 carries bevel gears 102, 102' that mate, respectively, with the screw gears. Through such an arrangement, the movement of carriage 84 is mirrored in the synchronized movement of carriage 84', eliminating the need for hand placement of stripping pins at the top of the work piece in stepping operations as previously described. A work piece register punched to the pins on both carriages will then be moved uniformly along the X or Y axis and its position indicated accurately by the read-out module. Employment of a parallel operating carriage on the Y axis may require modification of the table structure to receive the carriage in an appropriate position, for example by addition of a slot between table halves. The mechamism of FIG. 7 is intended to be suggestive of only one possible linking mechanism between opposite parallel operating carriages. It is anticipated that suitable separate servo-mechanism as moving means 82 could drive screws 76 and 76' in unison, in response to digitally selected positions entered in the read-out module. One or more such read-out modules 94 are therefore capable of not only indicating the position of the carriages 84 and 84' on either axis, but are also capable of acting as an analog computer in receiving location selection inputs and moving the various carriages to those positions. Stepping can thereby be performed by automated sequences under computer control.

Figure 6:
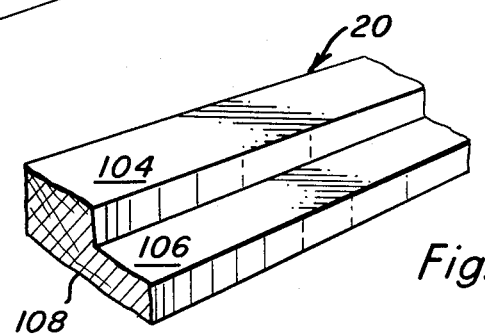
FIG. 6 is a fragmentary view of a non-grooved swinging U bar with recessed area for accommodating pin heads, adapted for use with the digital reading and positioning device of FIG. 5.

The swinging U bar 20 may have the configuration shown in FIG. 6 when used with the linear positioning apparatus 72. The face 104 of the bar abutting table side 46 provides the resting surface when the bar is pivoted to the left, as viewed in FIG. 5. A recessed face 106 at the outer edge of the U bar provides a clearance for the bar to overlap the stripping pins, which protrude above the plane of the vacuum grid. The U bar face 108 opposite from 106 may be of a single plane. The means for maintaining one face of the U bar in coplanar relationship with either half of the table top is preferred to be an eccentric mounting of the U bar to the table frame, as this would eliminate the need to elevate either half of the table that might be equipped with the linear positioning apparatus 72.

With further reference to FIG. 5, several modifications are shown relating to the placement of stripping pin grooves. In place of the removable U bar, the groove 96 may be formed about some or all of the vacuum grid, just outside the vacuum grooves but within the translucent material of the top. A further stripping pin groove 110 may be formed in table top 44' or 44 near the pivot axis of the swinging U bar, or a single common groove may be formed along the axis of the swinging U bar to serve both halves of the table, or any combination of these grooves may be employed on either half of the table. Both table halves may thereby have a full or partial perimeter of available stripping pin grooves.

The proposed arrangement of FIG. 5 permits operation of the table with the swinging U bar performing the functions also possible in the embodiment of FIG. 1. For some purposes, it may be desirable to provide underlighting through the translucent table top to only one of the halves, permitting selective underlighting of either half with any of the light wavelengths desired. Also, each half of the table may be equipped with linear positioning apparatus 72 so that even table top 44', which may be considered the working area for preliminary assembly of work pieces, may have digital control over work piece position on two axes, and if desired each axis may have parallel operating carriages 84, 84'. Groove 110 may provide the operating path for the parallel operating carriage 84' or may be replaced with a slot permitting an appropriately configured carriage to operate from beneath the table top.

It will thus be understood that the stripper's table offers a wide variety of improvements in the art, many of which have been mentioned for purposes of illustration. Persons skilled in the lithographic arts will readily realize still further applications and advantages.

I claim:

1. A stripper's table for lithographic work employing a film having an emulsion side, comprising:
   (a) a first table surface portion defining an open face vacuum grid adapted, in use, to carry a film in emulsion-side-up position;
   (b) a second table surface portion defining a light table surface;
   (c) a pivoted frame means for pivotal motion between said first and second table surface portions, wherein the frame means is adapted to carry, in use, a light permeable sheet of lithographic work piece carrier material into vacuum-completing contact with said first table surface portion for simultaneous emulsion contact with film on the first table surface portion vacuum grid by a carried lithographic work piece.

2. The table of claim 1, further comprising a table base carrying said first and second table surface portions and said pivoted frame means.

3. The table of claim 2, wherein said first table surface further comprises a light table surface, and said table further comprises a first selectively activated light source carried by said table base and underlying said first table surface portion.

4. The table of claim 1, wherein said second table surface portion further defines a vacuum grid on said light table surface.

5. The table of claim 1, wherein said first and second table surface portions are independent, at least one of which is carried by the table for vertical movement independent of the other table surface portion.

6. The table of claim 5, further comprising means for imparting vertical movement to at least said one table surface portion.

7. The table of claim 6, wherein said movement imparting means comprises a cam dimensioned to support said one table surface portion in a common plane with the other table surface portion in a first cam position, and dimensioned to support the one table surface portion in a vertically offset plane substantially parallel to the other table surface portion in a second cam position.

8. The table of claim 7, wherein said cam is configured such that the vertically offset plane of said one table surface portion is offset by substantially the vertical thickness of said frame means when the frame means is in a plane parallel to the one table surface portion.

9. The table of claim 1, wherein said frame means is pivotally connected to the table along an axis approximately dividing the first and second table surface portions, permitting the frame means to pivot substantially equally over each table surface portion.

10. The table of claim 9, wherein said frame means is suitably sized and shaped to lie substantially in a semi-perimeter about three sides of one of said table surface portions over which the frame means is pivoted.

11. The table of claim 10, further comprising a perimeter completing means complimentary in size and shape to said frame means and registerable to a fixed position completing a perimeter, in combination with said frame means, about substantially the entire first and second table surface portions.

12. The table of claim 11, wherein said frame means and perimeter completing means comprise guide slots in a face thereof sized to receive stripping pin bases in closely spaced relationship.

13. The table of claim 12, further comprising means for locating stripping pins at predetermined spacings about the perimeter of said first and second table surface portions.

14. The table of claim 13, wherein said locating means comprises gauge bars of predetermined lengths, and said frame means and perimeter completing means comprise a guide slot in a face thereof sized to receive gauge bars in closely spaced raltionship.

15. The table of claim 1, further comprising a perimeter member registerable to at least one fixed position at a perimeter to said first and second table surface portions.

16. The table of claim 1, further comprising a first selectively activated light source overhead with respect to said first and second table surface portions.

17. The table of claim 1, further comprising means for locating the plane of a single face of said frame means and, respectively, the plane of each of said first and second table surface portions in substantially the same plane when the frame means is located in position overlying each of the first and second table surface portions.

18. The table of claim 1, wherein said first table surface portion comprises at least a partial perimeter recess for receipt of stripping pin bases.

19. The table of claim 1, wherein said second table surface portion comprises at least a partial perimeter recess for receipt of stripping pin bases.

20. The table of claim 18 or 19, wherein said partial perimeter recess comprises a groove.

21. The table of claim 18 or 19, wherein said partial perimeter recess comprises a stabilizing step for receipt of a movable carriage that, in turn, is adapted to carry stripping pin bases.

22. The table of claim 1, further comprising linear positioning means for automatically indicating the position of a work piece on said first and second table surface portions along at least one coordinate axis in response to electronically sensed information.

23. The table of claim 22, wherein said linear positioning means is of the type having a sensor aligned with a coordinate axis of the table, a reading head movable with respect to the sensor, and a read-out module producing a digital indication of reading head position with respect to the sensor; and further comprising a carriage movable with the reading head and with respect to the sensor, said carriage having its top surface approximately coplanar with an adjacent portion of the top of the first and second table surface portions.

24. The table of claim 23, wherein said carriage defines a groove formed in the top surface thereof for receipt of stripping pin bases.

25. The table of claim 22, further comprising a linear positioning means along perpendicular sides of said first and second table surface portions for position indication along two coordinate axes.

26. The table of claim 22, wherein said linear positioning means comprises a first carriage movable along an edge of at least one of said first and second table surface portions, a second carriage movable along an opposite parallel edge of said at least one surface portion, and means for synchronizing the movement of the first and second carriages.

27. The table of claim 26, wherein said synchronizing means comprises a mechanically geared linking mechanism between said first and second carriages.

28. The table of claim 22, wherein said linear positioning means comprises a carriage movable with respect to said first and second table surface portions, motive means for moving said carriage, and analog computer means for controlling the motive means to move the carriage in response to information in the computer means.

29. A stripper's table for lithographic work employing film having an emulsion side, comprising:
 (a) a base;
 (b) a table top having an open face vacuum grid portion and a smooth light table portion carried by said base;
 (c) a first selectively activated light source underlying said table top;
 (d) a second selectively activated light source overhead with respect to said table top;
 (e) a first frame means pivotable between at least two positions overlying said two portions of the table top in substantially parallel planes thereto; and
 (f) means for selectively applying vacuum to the vacuum grid portion of the table top;
 wherein said frame means is adapted to carry, in use, a light permeable sheet of lithographic work piece carrier material for receipt of a lithographic work piece on the upper surface thereof while pivoted over the light table and subsequent pivotal motion of the frame means bringing the lithographic work piece into emulsion contact with film on said vacuum grid while the sheet of carrier material simultaneously provides a vacuum completing face of said vacuum grid.

30. The method of compositing lithographic work pieces onto a single light sensitive receiver having an emulsion side by use of a light table surface and an associated pivotable frame pivotable between positions overlying first and second distinct areas of said table surface, at least the second area including means for holding work pieces in close abutment for image transfer, comprising:
 (a) attaching a base of transparent sheet material to said movable frame and locating said frame over the first table area;
 (b) attaching a lithographic work piece to said base material on an upper surface thereof;
 (c) placing a light sensitive receiver on said second table area with emulsion side facing up;
 (d) pivoting the frame to its receivable position over the second table area and light sensitive receiver with direct contact between the light sensitive receiver and lithographic work piece;
 (e) exposing the light sensitive receiver to an actinic wavelength directed through said lithographic work piece and base material.

31. The method of claim 30, wherein said holding means is a vacuum grid on said second area, and further comprising after pivoting said frame over the second area, applying suction via the vacuum grid between the grid and the base of transparent sheet material and drawing the common base and attached work pieces close to the light sensitive receiver.

* * * * *